(12) United States Patent
Abrosimov et al.

(10) Patent No.: US 7,326,297 B2
(45) Date of Patent: Feb. 5, 2008

(54) DEVICE FOR THE PRODUCTION OF CRYSTAL RODS HAVING A DEFINED CROSS-SECTION AND COLUMN-SHAPED POLYCRYSTALLIZATION STRUCTURE BY MEANS OF FLOATING-ZONE CONTINUOUS CRYSTALLIZATION

(75) Inventors: Nikolai V. Abrosimov, Berlin (DE); Helge Riemann, Schulzendorf (DE)

(73) Assignee: PV Silicon Forschungs- und Produktions AG., Erfurt (DE)

( * ) Notice: Subject to any disclaimer, the term of this patent is extended or adjusted under 35 U.S.C. 154(b) by 313 days.

(21) Appl. No.: 10/513,320

(22) PCT Filed: May 6, 2003

(86) PCT No.: PCT/DE03/01515

§ 371 (c)(1),
(2), (4) Date: Nov. 18, 2004

(87) PCT Pub. No.: WO03/093540

PCT Pub. Date: Nov. 13, 2003

(65) Prior Publication Data

US 2005/0188918 A1    Sep. 1, 2005

(30) Foreign Application Priority Data

May 6, 2002    (DE) ................. 102 20 964

(51) Int. Cl.
*C30B 15/08* (2006.01)
(52) U.S. Cl. .................... 117/214; 117/18; 117/49; 117/213
(58) Field of Classification Search ................. 117/18, 117/49, 213, 214
See application file for complete search history.

*Primary Examiner*—Felisa Hiteshew
(74) *Attorney, Agent, or Firm*—Karl Hormann

(57) ABSTRACT

The invention relates to a device for the production of crystal rods having a defined cross-section and a column-shaped polycrystalline structure by means of floating-zone continuous crystallization, comprising at least one crucible filled with crystalline material, provided with a central deviation for transporting the contents of the crucible to a growing crystal rod arranged below the crucible, whereby the central deviation plunges into the melt meniscus, also comprising means for continuously adjustable provision of crystalline material to the crucible, and means for simultaneously feeding the melt energy and adjusting the crystallization front. In order to produce crystal rods having a defined diameter and a column-shaped polycrystalline structure using heating means which are technically less complex, while at the same time guaranteeing high crystallization rates and stable phase definition, the means for simultaneously feeding the melt energy and adjusting the crystallization front on the growing crystal rod (8) is a flat induction coil (5) which has an opening, said induction coil (5) being arranged at a distance from the crucible (4) and/or being vertically moveable in relation to the crystallization front.

17 Claims, 1 Drawing Sheet

B-B (1 : 2)

Figure 1:
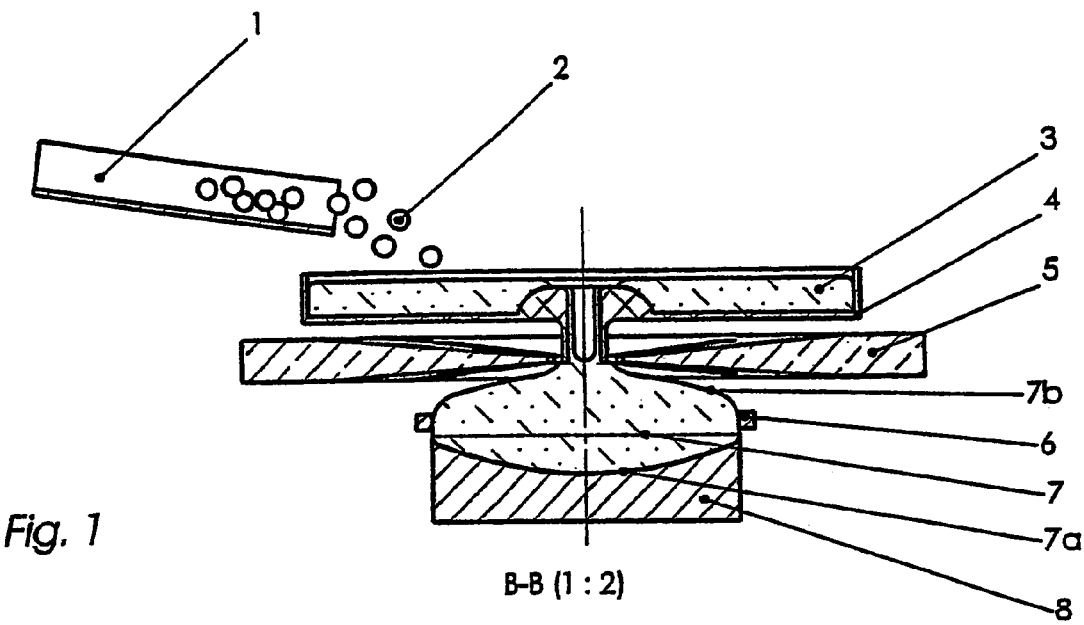

DEVICE FOR THE PRODUCTION OF CRYSTAL RODS HAVING A DEFINED CROSS-SECTION AND COLUMN-SHAPED POLYCRYSTALLIZATION STRUCTURE BY MEANS OF FLOATING-ZONE CONTINUOUS CRYSTALLIZATION

This application is a 371 of PCT/DE03/01515 May 6, 2003.

BACKGROUND OF THE INVENTION

1. Field of the Invention

The invention relates to a device for producing crystal rods of a defined cross-section and columnar polycrystalline structure by floating-zone continuous crystallization (CCC=crucible-fed continuous crystallization), provided with at least a crucible filled with crystal material and provided with a central output for feeding the content of the crucible to a growing crystal rod positioned under the crucible, the central output being immersed in the melt meniscus on the upper surface of the crystal rod, means for the continuous controllable feeding of the crucible with solid crystal material and means for the simultaneous feeding of the melt energy and setting of the crystallization front.

2. The Prior Art

In accordance with the prior art, the crystallization of polycrystalline block silicon from silicon granulate takes place in a temporal sequence of melting the raw material and the subsequent crystallization of the melt or by simultaneous melting and crystallizing in a direct thermal interaction.

Thus, 11$^{th}$ E.C. Photovoltaic Solar Energy Conference, 12-16 Oct. 1992, Montreux, Switzerland, pp. 1070-1073, describes an arrangement for producing polycrystalline block silicon by electromagnetic continuous casting (EMC—Electromagnetic Casting). The melt is enclosed by a tubular round or square induction coil (the principle of the cold reflector) provided for melting of the fed pieces of silicon and, at the same time, for the crystallization of the crystal rod which is continuously pulled from below in a downward direction. The high frequency field of the induction coil generates electromagnetic forces which keep the melt away from the wall of the crucible and which form the block silicon. The heater enclosing the silicon crystal rod and the support of the melt by magnetic forces are characteristic of this arrangement.

However, owing to the lateral heat infusion the phase boundary is strongly parabolically bent which leads to extreme thermo-mechanical stresses in the polycrystalline rod. Also, the majority of the crystals is not axially (columnar) oriented which reduces the effectiveness of solar cells made of this material. This effect increases with increasing drawing speed and larger rod cross-sections. Hence, for technically relevant cross-sections the drawing speed is limited to 0.8 to 1.2 mm/min.

In the FZ-method described in DE 195 38 020A1 the melt is heated by a resistance heater and the required energy infusion into the crystallization front is carried out by an induction heating coil, which is preferably structured as a plate-shaped flat coil with a central inner opening. This technically complex heating arrangement consisting of two separate heating means serves the controlled post-charging of silicon granulate as well as the prevention of undercooling of the crystal rod in the production of rod-shaped silicon mono-crystals of large diameters.

The proceedings of the 16$^{th}$ European Photovoltaic Solar Energy Conference, 1 to 5 May 200, Glasgow, UK, pp. 1616-1619, describe a system for producing crystal rods by inductive top-heated continuous crystallization (ITCC). The arrangement is provided with a funnel to which silicon granulate is fed and the tube of which terminates closely above the surface of the melt at the upper end of the crystal rod. Solid raw material pre-heated by a heat lamp is fed to the funnel by a feed conduit. The material drops through the funnel, which is surrounded by a flat annular inductor, onto the melt on the silicon crystal rod where the inductive heat causes the material flowing there to be melted. 1 to 2 cm below the liquid/solid phase the cylindrical polycrystalline silicon rod crystallizes while rotating about its axis. This arrangement makes possible a lesser bent phase boundary and crystallites of corresponding columnar orientation at a growth rate of at most 1 to 1.5 mm/min because the heating energy for melting a large quantity of raw material at the same time lowers the undercooling of the melt and, therefore, the rate of crystallization. However, this arrangement only allows the fabrication of crystal rods of circular cross-section.

The status report 1996 Potovoltaik presented by the project sponsor Biology, Energy, Ecology of the (German) Federal Ministry of Education, Science, Research and Technology—Research Center Juelich GmbH, on the occasion of the status seminar Photovoltaik 1996 at Bad Breisig (Germany) from 23 to 25 Apr. 1996, 5-1 to 5-11, refers to a crucible-fed continuous crystallization of silicon as well. It discloses an arrangement with a surface lamp heater for the crucible-fed continuous crystallization of silicon rods of round cross-section. The heat energy of the lamps is directed towards the upper end surface of the silicon rod; further lamps are disposed at the periphery and serve to heat the melt and the post-heating of the rod following re-crystallization. A frame of non-melting material is arranged above the silicon rod; it is partially submerged in the melt and acts as a shape-imparting element. By this arrangement, crystal rods of square cross-section may also be produced. The setting of a defined heating power poses problems, however, since at too high a heating power, the height of the free melt between the silicon rod and the frame increases, and liquid silicon may escape. At too low a heating power, the silicon rod may grow into the frame. To avoid the disadvantages of feeding cold granulate, a flat tub of graphite was arranged above the frame for dispensing, by way of a central bore, the melt provided for a liquid after-charge, into the shape-imparting frame. As may be seen, the setting of a defined/optimal heating power is difficult and was here realized by complex means, i.e. focused lamp radiation and an additional reflector. As has already been mentioned supra, two optical heaters were applied, one being used for melting the raw material, the other one for controlling the crystallization of the silicon rod to be produced.

Another possibility for a crucible-fed continuous crystallization of silicon is described in the publication mentioned above and relates to a float-zone crystal drawing arrangement. Above an induction coil, a storage bunker is provided within a receptacle for receiving the silicon granulate for the after-charging. The granulate was fed by way of a quartz funnel through openings in the inductor to the surface of the silicon rod where it is almost completely melted. Several silicon grains did, however, escape to the edge of the rod where they nucleated. In order to achieve complete melting of the granulate, it was fed through a quartz tube protruding through the inductor and touching the melt on the silicon rod. While this results in a good columnar grain structure, melting of the material as well as crystallization in this arrangement take place below the frame. The energy distribution of the heating arrangement limits the melting rate as well as rate of crystallization. No shape-imparting frame was used in respect of the second-mentioned arrangement.

OBJECT OF THE INVENTION

It is an object of the invention to provide an arrangement for the production of crystal rods of defined cross-section and columnar polycrystalline structure which by using technically less complex heating means, compared to the prior art, nevertheless provides for a high rate of crystallization at a stable phase boundary and, at the same time, allows for adjustment of the heating power as required by an actual application.

SUMMARY OF THE INVENTION

In an arrangement of the kind referred to above the object is accomplished in accordance with the invention by placing, closely above the growing crystal rod, a frame which touches the melt, by the means for the simultaneous feeding of melting energy and the setting of the crystallizing front on the growing crystal rod being a flat induction coil provided with an opening, the induction coil being vertically moveable as regards its distance from the crucible and/or crystallization front and structured such that above the induction coil the raw material is melted in the crucible and that below the induction coil the melted material fed through the central tubular output conduit extending through the opening of the induction coil to the surface of the silicon rod crystallizes and by generating a temperature field which is adjusted to the desired cross-section of the crystal rod.

In the arrangement in accordance with the invention, the melt which is fed by way of the central cylindrical output conduit through the opening in the induction coil directly downwardly onto the crystal rod is produced within the crucible. Not only is the melting of the material thus thermally substantially disconnected from the crystallization of the rod, but it also allows for a greater degree of freedom as regards the structuring of the inductor. The latter ensures the presence of a closed melt meniscus and of a temperature field which in combination with the guiding frame touching the meniscus imposes upon the non-rotating rod a defined, preferably, square cross-section. By longitudinally moving the crystal rod in a downward direction, the growth phase boundary is generated a few mm below the frame, and in correspondence with the substantially axial heat current the orientation of the crystallites is predominantly columnar. The heating inductor arranged between the crucible and the crystal is to be adjusted by the person skilled in the art so as to conform to the parameters of the crystal rod to be drawn (shaping of the temperature field for the desired cross-section of the rod, effective transmission of power).

By varying the distance of the induction coil from the melting crucible and/or from the crystallization front, the arrangement in accordance with the invention makes it possible thermally to disconnect the melting process of the granulate from the crystallization process of the melt; this leads to higher rates of crystallization at a stable phase boundary for the continuously growing polycrystalline rod. It is thus possible even during the production process to set the division of the total power between melting and crystallization power and, hence, the position of the phase boundary.

In one embodiment the guiding frame is formed of a resistant material and is of a defined geometric configuration.

In a further embodiment an additional radiation heat source is arranged above the crucible for more rapidly melting the raw material; in this manner the admission of heat to the crucible can be set independently of the crystal rod. This may be necessary, for instance, for making available the required amount of heat when working under protective gas.

In another preferred embodiment the bottom wall of the crucible is raised at the connection to the cylindrical output conduit. This is to prevent a complete emptying of the crucible and, therefore, its destruction.

Radiation protection shields are arranged at the level of the crystallization front around the crystal rod for insulation and for ensuring planar phase boundaries.

In a further embodiment, the planar induction coil is structured such that the phase boundary does not touch the guide frame. The coil is of square or rectangular configuration.

DESCRIPTION OF THE SEVERAL DRAWINGS

Figure 2:
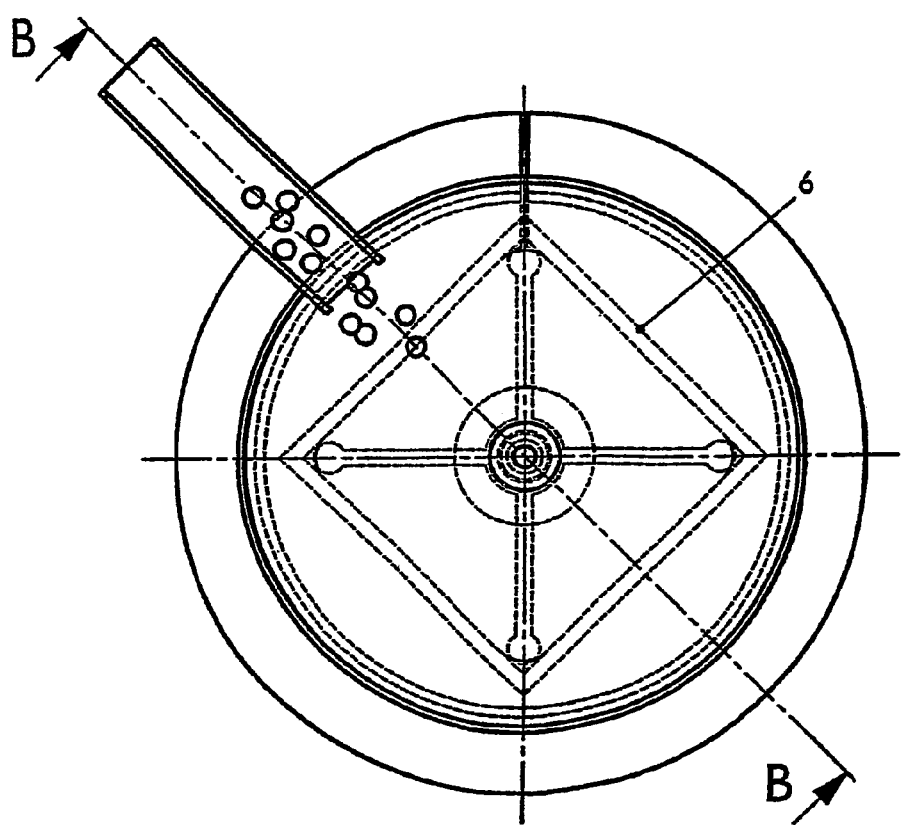

The novel features which are considered to be characteristic of the invention are set forth with particularity in the appended claims. The invention itself, however, in respect of its structure, construction and lay-out as well as manufacturing techniques, together with other objects and advantages thereof, will be best understood from the following description of preferred embodiments when read in connection with the appended drawings, in which:

FIG. 1 schematically depicts an arrangement in accordance with the invention in longitudinal section;

FIG. 2 schematically depicts an top view of FIG. 1 with an inductor for producing a crystal rod of square cross-section.

DETAILED DESCRIPTION OF THE PREFERRED EMBODIMENT

FIG. 1 is a longitudinal sectional view of an arrangement in accordance with the invention, in which solid raw material 2 (e.g. silicon granulate) is fed from a conveyor 1 into a crucible 4. The crucible 4 is provided with a central downwardly directed output. Below the crucible 4 and above a crystal rod 8, there is arranged the flat inductor 5 for HF-heating. A guide frame 6 is in contact with the melt meniscus 7b and determines the shape thereof. Energy supply is set by means of the HF heating such that the raw material 2 fed into the crucible 4 is melted therein (melt 3) and that the melted material fed to the crystal rod 8 crystallizes as the rod 8 is slowly drawn in a downward direction. The three phase line 7 and the crystallization phase boundary 7a are also shown. For setting a balanced ratio between the power for melting the raw material 2 and the power for the crystallization, the distance of the crucible 4 from the inductor 5 is variable.

The schematic top view of FIG. 2 of the arrangement shown in FIG. 1 depicts a defined shape of an inductor 5, here shown to be of square symmetry, for producing a crystal rod of square cross-section.

What is claimed is:

1. An apparatus for fabricating a crystal rod of a predetermined cross-section and columnar polycrystalline structure, comprising:
   a crucible for receiving crystal material;
   means for feeding crystal material into the crucible;
   vertically movable means below the crucible for supporting the crystal rod at a first end thereof;

a conduit connected to the crucible for feeding molten crystal from the crucible into a meniscus of molten crystal at an end of the crystal rod opposite the first end;

a frame defining an opening and disposed to contact the molten crystal closely adjacent to a second end of the crystal rod opposite the first end;

an induction coil defining an opening surrounding the conduit and mounted for movement relative to the crucible and the second end of the crystal rod for melting the crystal material above the coil and for crystallizing the molten crystal material moving through the conduit below the coil.

2. The apparatus of claim 1, wherein the frame is made of a resistant material and wherein its opening defines the predetermined cross-section.

3. The apparatus of claim 1, further comprising at least one optical heater disposed above the induction coil for melding the crystal material in the crucible.

4. The apparatus of claim 1, wherein the crucible is provided with a bottom wall provided with a raised portion for connecting the conduit.

5. The apparatus of claim 1, further comprising radiation protection shields surrounding the crystal rod adjacent its second end.

6. The apparatus of claim 1, wherein the induction coil is of substantially rectangular configuration.

7. The apparatus of claim 6, wherein the induction coil is of substantially square configuration.

8. An apparatus for fabricating a crystal rod of predetermined cross-section and columnar polycrystalline structure by floating-zone crystallization, comprising:

a crucible for receiving crystal material;

means for the continuous controlled feeding of crystal material into the crucible;

a substantially flat induction coil positioned below the crucible for melting crystal material and defining a first opening;

means below the induction coil for supporting the crystal rod by a first end thereof;

a conduit extending from the crucible through the first opening for feeding molten crystal material to a second end of the crystal rod opposite the first end thereof;

means for adjusting the position of the induction coil relative to the crucible and the second end of the crystal rod such that above the induction coil the crystal material is melted in the crucible and below the induction coil the crystal material crystallizes at a crystallization front defined by the position of the induction coil relative to the second end;

means for establishing a temperature field conforming to the predetermined cross-section of the crystal rod; and a frame defining a second opening and positioned adjacent the second end of the rod in contact with the molten crystal material.

9. The apparatus of claim 8, wherein the means for establishing the temperature field is the configuration of the induction coil.

10. The apparatus of claim 9, wherein the induction coil is of substantially rectangular configuration.

11. The apparatus of claim 10, wherein the induction coil is of substantially square configuration.

12. The apparatus of claim 8, wherein the frame is made of resistant material and the second opening of the predetermined cross-section.

13. The apparatus of claim 8, wherein the predetermined cross-section is of square configuration.

14. The apparatus of claim 8, further comprising additional heaters for melting the crystal material and disposed above the induction coil.

15. The apparatus of claim 14, wherein the additional heat is an optical radiation heater.

16. The apparatus of claim 8, wherein the crucible is provided with a bottom wall having a raised portion therein for receiving the conduit.

17. The apparatus of claim 8, further comprising radiation protection shields disposed around the crystal rod.

* * * * *